(12) United States Patent
Sunohara et al.

(10) Patent No.: US 7,667,474 B2
(45) Date of Patent: Feb. 23, 2010

(54) PROBE DEVICE

(75) Inventors: Masahiro Sunohara, Nagano (JP);
Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 58 days.

(21) Appl. No.: 11/984,601

(22) Filed: Nov. 20, 2007

(65) Prior Publication Data
US 2008/0116925 A1    May 22, 2008

(30) Foreign Application Priority Data
Nov. 21, 2006    (JP)    ............ P.2006-314568

(51) Int. Cl.
*G01R 31/02*    (2006.01)
*G01R 1/073*    (2006.01)

(52) U.S. Cl. ........................ 324/760; 324/754
(58) Field of Classification Search .......... 324/754–765
See application file for complete search history.

(56) References Cited

U.S. PATENT DOCUMENTS

| | | | | |
|---|---|---|---|---|
| 4,839,587 A | * | 6/1989 | Flatley et al. ............ 324/761 |
| 5,006,796 A | * | 4/1991 | Burton et al. ............ 324/760 |
| 5,124,639 A | * | 6/1992 | Carlin et al. ............ 324/760 |
| 5,489,851 A | * | 2/1996 | Heumann et al. ......... 324/537 |
| 6,181,145 B1 | * | 1/2001 | Tomita et al. ............ 324/754 |
| 6,690,185 B1 | * | 2/2004 | Khandros et al. ........ 324/758 |
| 7,002,363 B2 | * | 2/2006 | Mathieu ................... 324/758 |
| 7,071,714 B2 | * | 7/2006 | Eldridge et al. .......... 324/754 |
| 7,091,733 B2 | * | 8/2006 | Takekoshi et al. ........ 324/760 |
| 7,495,458 B2 | * | 2/2009 | McClanahan et al. .... 324/754 |

FOREIGN PATENT DOCUMENTS

JP    2000-138268    5/2000

* cited by examiner

*Primary Examiner*—Ernest F Karlsen
(74) *Attorney, Agent, or Firm*—Drinker Biddle & Reath LLP (57) ABSTRACT

A probe device includes a stage for fixing a semiconductor device having an external connection pad; a heating unit provided in the stage, for heating the semiconductor device to a predetermined temperature; and a probe card having a probe pin and a support substrate for supporting the probe pin, in which a resistance heating element is provided to the support substrate so as to heat a portion of the support substrate corresponding to a disposition portion of the probe pin to a temperature substantially equal to the predetermined temperature.

6 Claims, 7 Drawing Sheets

PROBE DEVICE

This application claims priority to Japanese Patent Application No. 2006-314568, filed Nov. 21, 2006, in the Japanese Patent Office. The priority application is incorporated by reference in its entirety.

TECHNICAL FIELD

The present disclosure relates to a probe device, and more particularly, to a probe device for performing an electrical inspection of a semiconductor device heated to a predetermined temperature.

RELATED ART

An electrical inspection of a semiconductor device including a semiconductor substrate having a plurality of chip forming areas and a semiconductor integrated circuit formed in the plurality of chip forming areas of the semiconductor substrate and having an external connection pad is performed by an inspection apparatus equipped with a tester and a probe device electrically connected to the tester.

Figure 1:
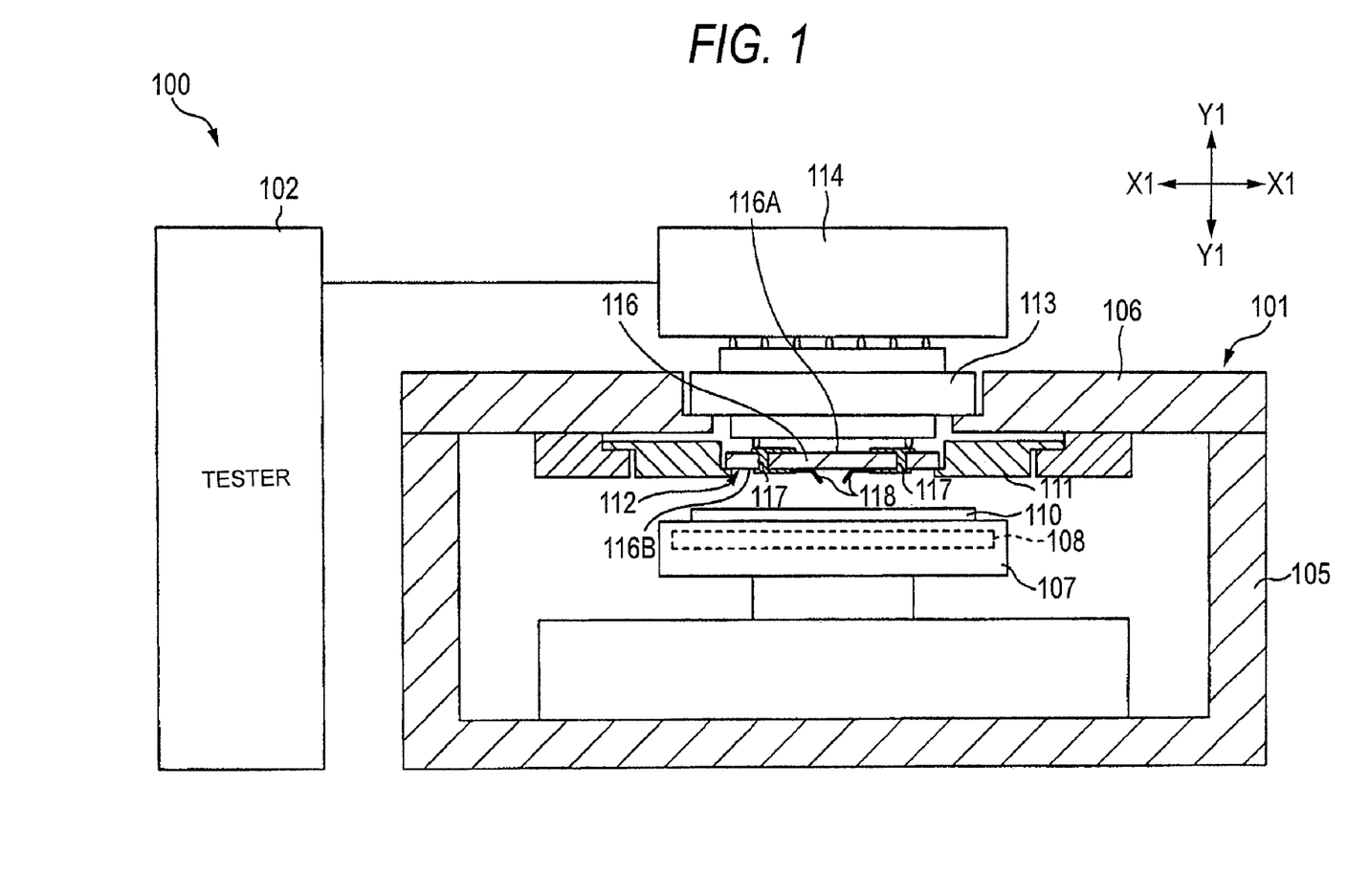
FIG. 1 is a cross-sectional view of a related-art inspection device.

FIG. 1 is a cross-sectional view of a related-art inspection apparatus. In FIG. 1, an X1-X1 direction indicates a surface direction of a stage 107, and a Y1-Y1 direction indicates a direction perpendicular to the surface direction of the stage 107.

Referring to FIG. 1, a related-art inspection apparatus 100 includes a probe device 101 and a tester 102. The probe device 101 includes a casing 105, a head plate 106, the stage 107, a heating unit 108, a probe card holder 111, a probe card 112, a contact ring 113 and a test head 114.

The casing 105 houses the stage 107. The upper end of the casing 105 is formed as an opening end. The head plate 106 is used to hold the contact ring 113. The head plate 106 covers the upper end of the casing 105 to seal an interior space of the casing 105.

The stage 107 is used to fix a semiconductor device 110. The stage 107 is configured to be movable in the X1-X1 and Y1-Y1 directions.

The heating unit 108 is incorporated in the stage 107. The heating unit 108 is used to heat the semiconductor device 110 via the stage 107 to a predetermined temperature (at which an electrical inspection of the semiconductor device 110 is performed). The probe card holder 111 is used to hold the probe card 112.

The probe card 112 is held in the probe card holder 111. The probe card 112 is disposed below the contact ring 113. The probe card 112 includes a support substrate 116, a wiring pattern 117 and a probe pin 118. The support substrate 116 is formed in a board-like shape and has a through-hole for disposing a portion of the wiring pattern 117. The support substrate 116 is a substrate for disposing the wiring pattern 117 and the probe pin 118.

The wiring pattern 117 penetrates the support substrate 116 so as to extend to both surfaces 116A and 116B of the support substrate 116. The portion of the wiring pattern 117 disposed on the top surface 116A of the support substrate 116 is electrically connected to the contact ring 113. The portion of the wiring pattern 117 disposed on the bottom surface 116B of the support substrate 116 is connected to the probe pin 118. The wiring pattern 117 is used to electrically connect the probe pin 118 to the contact ring 113.

The probe pin 118 is provided on the bottom surface 116B of the support substrate 116. The probe pin 118 is connected to the wiring pattern 117. The probe pin 118 is brought into contact with an external connection pad (not shown) provided in the semiconductor integrated circuit when the electrical inspection of the semiconductor device 110 is performed.

The contact ring 113 is held in the head plate 106. The contact ring 113 is used to transmit an electrical signal between the probe card 112 and the test head 114 so that the electrical signal is communicated therebetween.

The test head 114 is disposed on the contact ring 113. The test head 114 is electrically connected to the contact ring 113 and the tester 102.

The tester 102 is electrically connected to the test head 114. The tester 102 controls an overall operation of the probe device 101. The tester 102 drives the probe device 101 in accordance with a program previously stored in the tester 102.

The inspection apparatus 100 having the above configuration performs the electrical inspection of the semiconductor device 110 (specifically, a plurality of semiconductor integrated circuits provided in the semiconductor device 110) in a state in which the semiconductor device 110 is heated to the predetermined temperature by the heating unit 108.

However, since the related-art probe device 101 is configured to heat the semiconductor device 110, the semiconductor device 110 is thermally deformed and thus a relative positional relation between the probe pin 118 and the external connection pad (not shown) of the semiconductor integrated circuit is changed. Therefore, a contact failure occurs between the probe pin 118 and the external connection pad (not shown). Accordingly, it is difficult to perform the electrical inspection of the semiconductor device 110 with high precision. Such a problem becomes more likely when performing the electrical inspection is performed of a semiconductor device having a miniaturized semiconductor integrated circuit.

Figure 2:
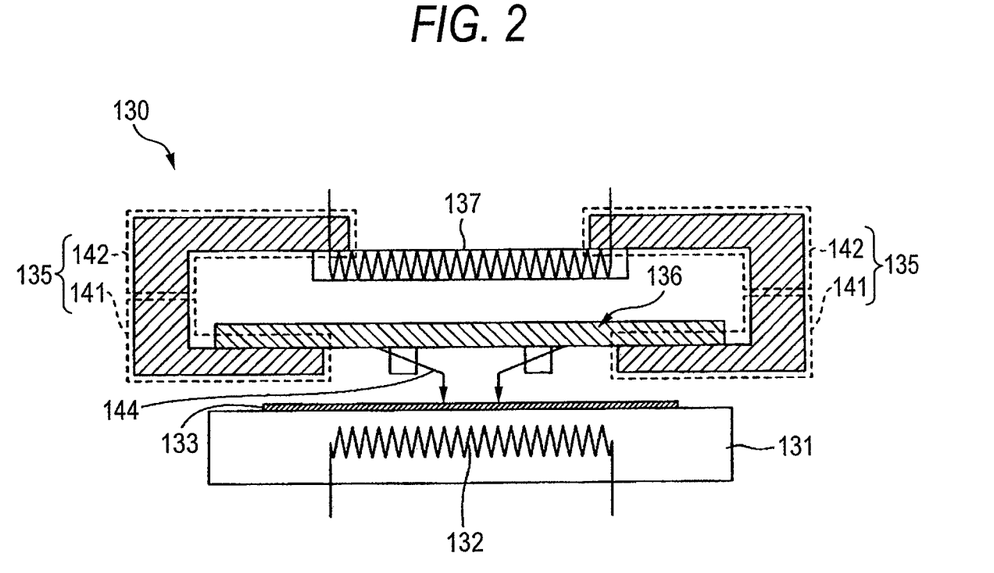
FIG. 2 is a cross-sectional view of a principal part of the related-art probe device.

As a related-art probe device that solves the problem, there is a probe device 130 as shown in FIG. 2.

FIG. 2 is a cross-sectional view showing a principal part of the related-art probe device.

Referring to FIG. 2, the related-art probe device 130 includes a stage 131, a first heater 132, a probe card holder 135, a probe card 136 and a second heater 137.

The first heater 132 is incorporated in the stage 131 for fixing a semiconductor device 133. The first heater 132 is a heater for heating the semiconductor substrate 133 to a predetermined temperature (at which the electrical inspection of the semiconductor substrate 133 is performed).

The probe card holder 135 includes a probe card holding unit 141 and a heater holding unit 142. The probe card holding unit 141 is disposed above the stage 131. The probe card holding unit 141 is used to hold the probe card 136. The heater holding unit 142 is disposed on the probe card holding unit 141 and is configured integrally with the probe card holding unit 141. The heater holding unit 142 is used to hold the second heater 137.

The probe card 136 is held in the probe card holding unit 141. The probe card 136 includes a probe pin 144 which is brought into contact with an external connection pad (not shown) of the semiconductor device 133 when the electrical inspection of the semiconductor device 133 is performed.

The second heater 137 is held in the heater holding units 142. The second heater 137 heats the probe card 136 from a surface of the probe card 136 opposite a disposition surface of the probe pin 144.

As described above, the second heater 137 is provided in the probe card holding unit 141 that is disposed above the probe card 136, and the probe card 136 is heated by the second heater 137 from the surface of the probe card 136 opposite the disposition surface of the probe pin 144. Therefore, it is possible to reduce deformation of the probe card 136 caused by the heat from the first heater 132. Accordingly, it is possible to measure electrical properties of the semiconductor device 133 heated to the predetermined temperature with high precision (see Japanese Unexamined Patent Application Publication No. 2000-138268, for example).

Although the related-art probe device 130 can measure the electrical properties of the semiconductor device 133 heated to a predetermined temperature with high precision, it is necessary to equip the heater holding unit 142 for holding the second heater 137, thus increasing the size of the probe device 130.

SUMMARY

Exemplary embodiments of the present invention provide a probe device capable of measuring electrical properties of a semiconductor device that is heated to a predetermined temperature with high precision while reducing the size of the probe device.

According to an aspect of the invention, there is provided a probe device including: a stage for fixing a semiconductor device having an external connection pad; a heating unit provided in the stage, for heating the semiconductor device to a predetermined temperature; and a probe card having a probe pin and a support substrate for supporting the probe pin, in which the probe device performs an electrical inspection of the semiconductor device by bringing the probe pin in contact with the external connection pad of the semiconductor device heated to the predetermined temperature, and in which a resistance heating element is provided to the support substrate so as to heat a portion of the support substrate corresponding to a disposition portion of the probe pin to a temperature substantially equal to the predetermined temperature.

According to above aspect of the invention, since the resistance heating element is provided to the support substrate so as to heat the portion of the support substrate corresponding to the disposition portion of the probe pin to a temperature substantially equal to the predetermined temperature (at which an electrical inspection of the semiconductor device is performed), it is possible to measure electrical properties of a semiconductor device that is heated to a predetermined temperature with high precision and to reduce the size of the probe device.

According to the invention, it is possible to provide a probe device capable of measuring electrical properties of a semiconductor device that is heated to a predetermined temperature with high precision while reducing the size of the probe device.

Other features and advantages may be apparent from the following detailed description, the accompanying drawings and the claims.

DETAILED DESCRIPTION

Next, embodiments of the invention will be described with reference to the accompanying drawings.

First Embodiment

Figure 3:
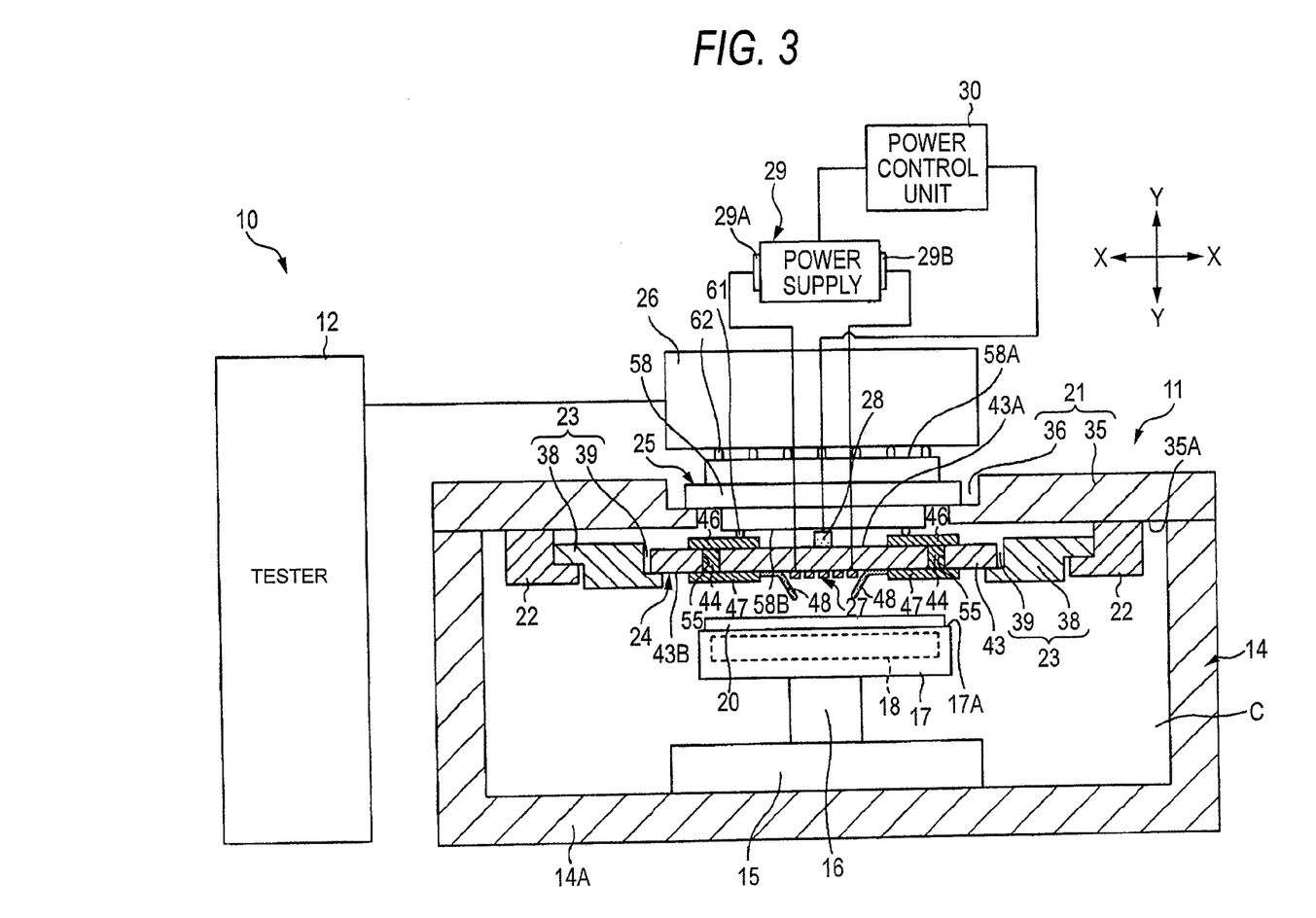
FIG. 3 is a cross-sectional view of an inspection apparatus according to a first embodiment of the invention.

FIG. 3 is a cross-sectional view of an inspection apparatus according to a first embodiment of the invention. In FIG. 3, an X-X direction indicates a surface direction of a stage 17, and a Y-Y direction indicates a direction perpendicular to the surface direction of the stage 17.

Referring to FIG. 3, an inspection apparatus 10 according to the first embodiment of the invention includes a probe device 11 and a tester 12. The probe device 11 includes a casing 14, a drive unit 15, a support 16, the stage 17, a heating unit 18, a head plate 21, a holder support 22, a probe card holder 23, a probe card 24, a contact ring 25, a test head 26, a resistance heating element 27, a temperature detecting unit 28, a power supply 29 and a power control unit 30.

The casing 14 houses the drive unit 15, the support 16 and the stage 17. An upper end of the casing 14 is formed as an opening end.

The drive unit 15 is provided at a bottom 14A of the casing 14. The drive unit 15 is used to move the stage 17 in the X-X and Y-Y directions by means of the support 16. The support 16 is provided on the drive unit 15. The support 16 is used to movably support the stage 17.

The stage 17 is fixed to an upper end of the support 16. The stage 17 is used to fix a semiconductor device 20. The semiconductor device 20 is disposed on a top surface 17A of the stage 17. The stage 17 moves integrally with the support 16 when the support 16 is moved by the drive unit 15.

Figure 4:
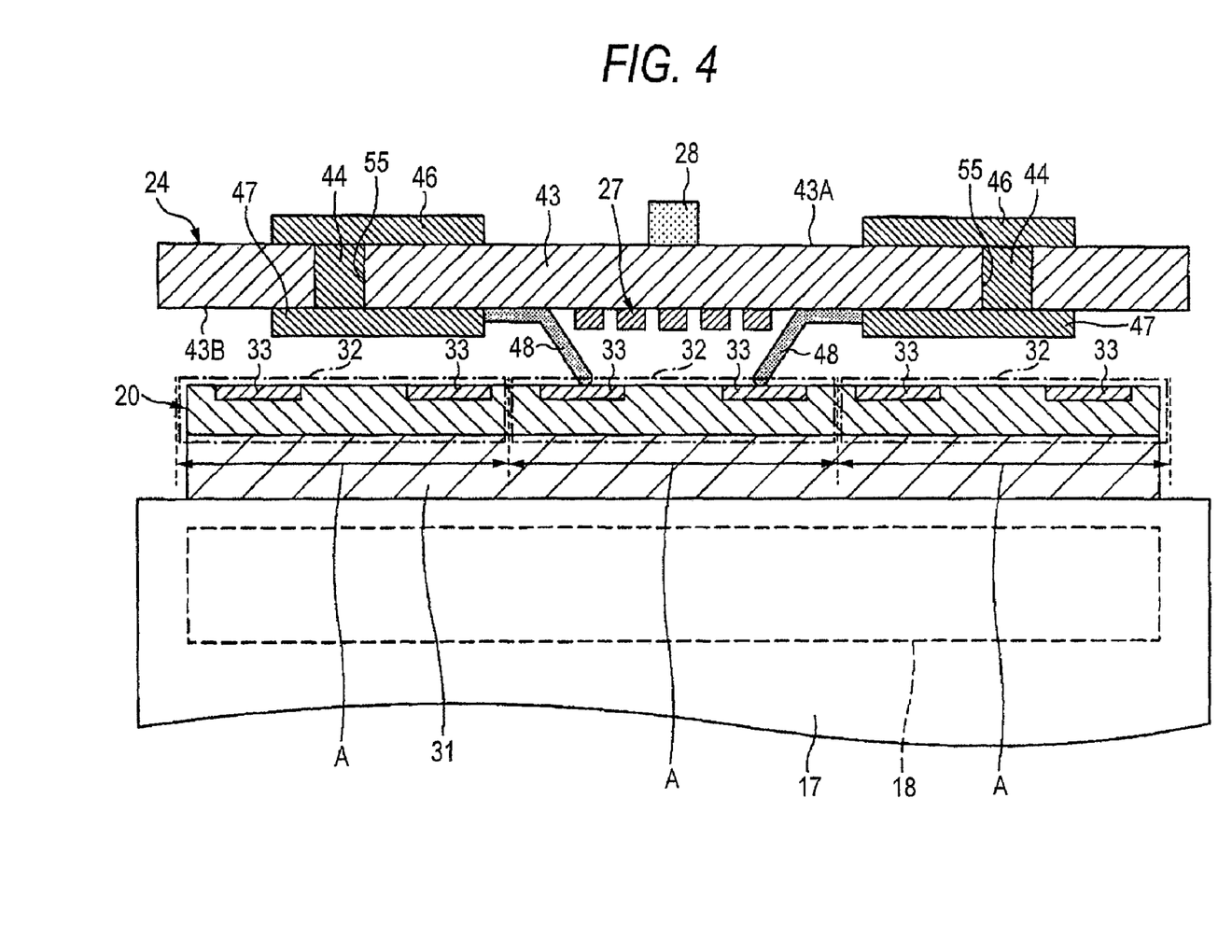
FIG. 4 is a cross-sectional view of a probe card that is electrically connected to an external connection pad of a semiconductor device.

FIG. 4 is a cross-sectional view of a probe card that is electrically connected to an external connection pad of a semiconductor device. In FIG. 4, constituent elements identical to those of the inspection apparatus 10 according to the first embodiment are denoted by the same reference numerals.

Here, a configuration of the semiconductor device 20 of which the electrical inspection is performed by the inspection apparatus 10 will be described with reference to FIG. 4. The semiconductor device 20 includes a semiconductor substrate 31 and a plurality of semiconductor integrated circuits 32. The semiconductor substrate 31 includes a plurality of circuit forming areas A in which the semiconductor integrated circuits 32 are formed. A Si substrate or a Ga—As substrate may be used as the semiconductor substrate 31, for example.

The semiconductor integrated circuits 32 are disposed on portions of the semiconductor substrate 31 corresponding to the circuit forming areas A. The semiconductor integrated circuit 32 includes a diffusion layer (not shown), an insulating layer (not shown), a via-hole (not shown), a wiring (not shown), and an external connection pad 33 that is electrically connected to the diffusion layer, the via-hole and the wiring.

The external connection pad 33 is formed on the uppermost layer of the semiconductor integrated circuit 32. The external connection pad 33 makes contact with a probe pin 48 that is provided in the probe card 24 when an electrical inspection of the semiconductor device 20 is performed.

Referring to FIG. 3, the heating unit 18 is incorporated in the stage 17. The heating unit 18 is used to heat the semiconductor device 20 via the stage 17 so that the temperature of the semiconductor device 20 reaches a predetermined temperature Tx. The predetermined temperature Tx represents the temperature at which a burn-in test (heating test) is performed for the semiconductor device 20. Although the predetermined temperature Tx may change depending on the type or inspection purpose of the semiconductor integrated circuit 32 that is provided in the semiconductor device 20, the temperature is set in the range of 90° C. to 150° C., for example. A heater may be used as the heating unit 18, for example.

The head plate 21 includes a head plate body 35 and a contact ring mounting portion 36. The head plate 35 is provided on the casing 14. The head plate body 35 is configured so as to be open and closed with respect to the casing 14. The contact ring mounting portion 36 is configured to penetrate the vicinity of the central of the head plate body 35. The contact ring mounting portion 36 is used to mount the contact ring 25 on the head plate 21. A space C of the casing 14 is sealed when the head plate 21 having the contact ring 25 mounted thereon covers the upper end of the casing 14.

The holder support 22 is provided on a bottom surface 35A of the head plate body 35. The holder support 22 is used to support the probe card holder 23.

The probe card holder 23 includes a holder body 38 and a probe card mounting portion 39. The holder body 38 is supported by the holder support 22. The probe card mounting portion 39 is configured to penetrate the holder body 38. The probe card mounting portion 39 is used to mount the probe card 24 on the probe card holder 23.

Referring to FIGS. 3 and 4, the probe card 24 is disposed in the probe card mounting portion 39 and includes a support substrate 43, a through via-hole 44, an upper wiring 46, a lower wiring 47 and the probe pin 48.

The support substrate 43 is formed in a board-like shape and has a plurality of through-holes 55. As a material for the support substrate 43, a material having substantially the same thermal expansion coefficient as the semiconductor substrate 31 may be used. Specifically, when the Si substrate is used as the semiconductor substrate 31, Si may be used as the material for the support substrate 43.

As described above, since the support substrate 43 is formed of the material having substantially the same thermal expansion coefficient as the semiconductor substrate 31, it is possible to decrease a difference in thermal expansion coefficient between the probe card 24 and the semiconductor device 20. Accordingly, it is possible to reduce a contact failure between the probe pin 48 and the external connection pad 33.

The through via-hole 44 is provided in the through-holes 55 formed on the support substrate 43. The upper end of the through via-hole 44 is connected to the upper wiring 46, and the lower end of the through via-hole 44 is connected to the lower wiring 47

The upper wiring 46 is provided at a portion on a top surface 43A of the support substrate 43 corresponding to a disposition position of the through via-hole 44. The upper wiring 46 is connected to the upper end of the through via-hole 44. The lower wiring 47 is provided at a portion on a bottom surface 43B of the support substrate 43 corresponding to the disposition position of the through via-hole 44. The lower wiring 47 is connected to the lower end of the through via-hole 44. The lower wiring 47 is electrically connected to the upper wiring 46 via the through via-hole 44.

The probe pin 48 is provided on the bottom surface 43B of the support substrate 43. The probe pin 48 is connected to the lower wiring 47. Accordingly, the probe pin 48 is electrically connected to the upper wiring 46 via the lower wiring 47 and the through via-hole 44. The probe card 24 is used as an inspection jig for pressing the probe pin 48 against the external connection pad 33 of the semiconductor integrated circuits 32 so that an electrical signal is inputted to the external connection pad 33.

The contact ring 25 is detachably mounted on the contact ring mounting portion 36. The contact ring 25 includes a contact ring body 58, a first connection pin 61 and a second connection pin 62. The contact ring body 58 is electrically connected to the probe card 24 and the test head 26 via the first connection pin 61 and the second connection pin 62. The contact ring body 58 is used to transmit signals between the probe card 24 and the test head 26.

The first connection pin 61 is disposed on a bottom surface 58B of the contact ring body 58. The first connection pin 61 protrudes out from the bottom surface 58B of the contact ring body 58. The end of the first connection pin 61 is electrically connected to the upper wiring 46 of the probe card 24.

The second connection pin 62 is disposed on a top surface 58A of the contact ring body 58. The second connection pin 62 protrudes out from the top surface 58A of the contact ring body 58. The end of the second connection pin 62 protruding out from the top surface 58A of the contact ring body 58 is electrically connected to the test head 26. The second connection pin 62 is electrically connected to the first connection pin 61.

The test head 26 is provided on the contact ring 25. The test head 26 is electrically connected to the tester 12. The test head 26 is used to receive inspection conditions of the semiconductor device 20 transmitted from the tester 12 and to transmit the inspection conditions to the probe card 24 via the contact ring 25.

The resistance heating element 27 is provided on a portion of the bottom surface 43B of the support substrate 43, which is surrounded by the probe pin 48.

Figure 5:
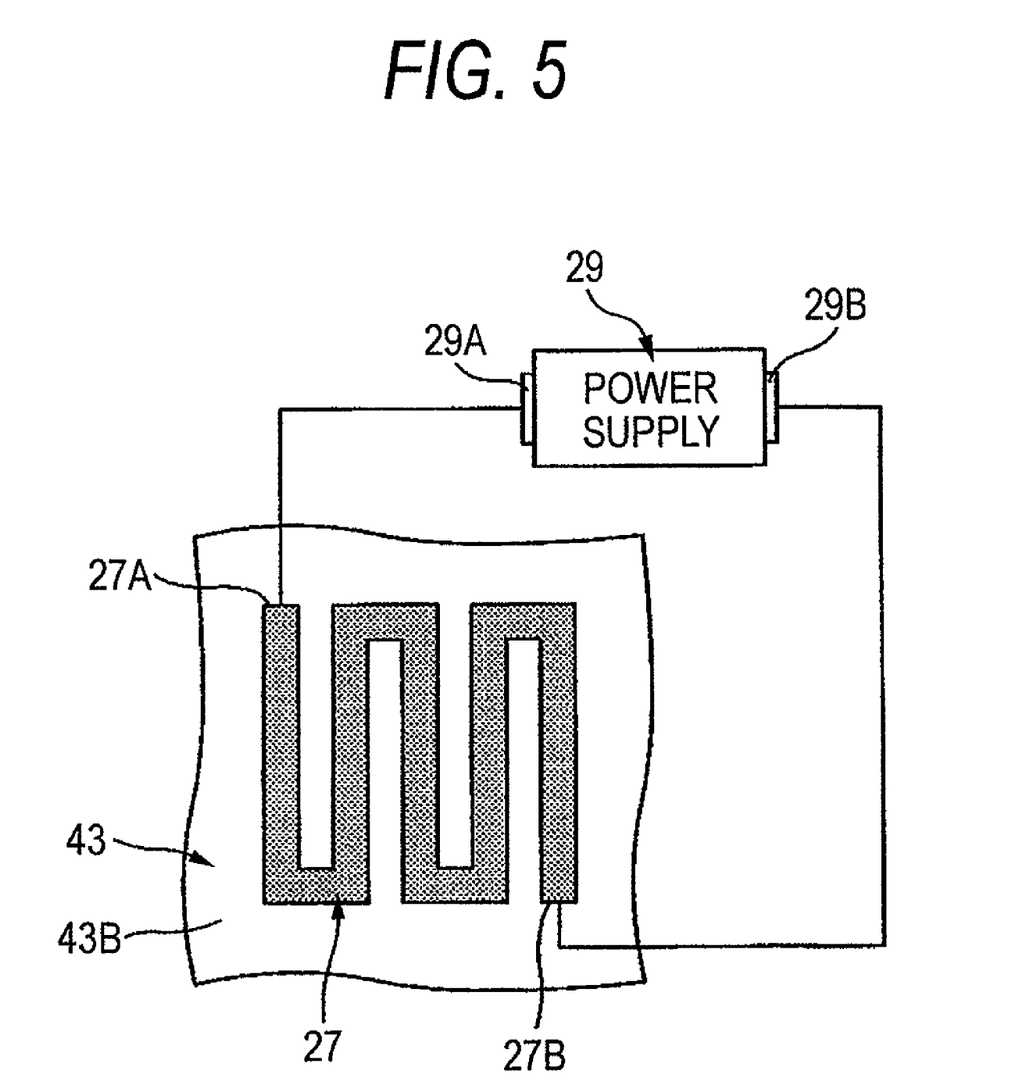
FIG. 5 is a plan view of a resistance heating element.

FIG. 5 is a plan view of the resistance heating element.

Referring to FIG. 5, the resistance heating element 27 is formed of a wiring pattern (specifically, the resistance heating element is formed of a wiring pattern that is formed by patterning a metallic film). One end 27A of the resistance heating element 27 is electrically connected to a plus terminal 29A of the power supply 29 while the other end 27B of the resistance heating element 27 is electrically connected to a minus terminal 29B of the power supply 29. The resistance heating element 27 generates heat when supplied with power from the power supply 29. The resistance heating element 27 is used to heat a portion of the support substrate 43 corresponding to the disposition position of the probe pin 48 so that the temperature of the probe pin 48 is substantially equal to the predetermined temperature Tx (at which the electrical inspection of the semiconductor device 20 is performed). As a material for the resistance heating element 27, a metal having a high resistance value such as Ti or Ni may be used. When Ni is used as the material for the resistance heating element 27, the resistance heating element 27 may be formed using a method such as a subtractive process, a semi-additive process or a printing process.

As described above, since the resistance heating element 27 is disposed on the bottom surface 43B of the support substrate 43, the support substrate 43 is heated so that the temperature at the portion of the support substrate 43 corresponding to the disposition position of the probe pin 48 reaches the predetermined temperature Tx (at which the electrical inspection of the semiconductor device 20 is performed). Therefore, it is possible to prevent the contact failure between the probe pin 48 (specifically, the front end of the probe pin 48 which makes contact with the external connection pad 33) and the external connection pad 33. Accordingly, it is possible to perform the electrical inspection of the semiconductor device 20 heated to the predetermined temperature Tx with high precision.

Since the resistance heating element 27 is provided on the bottom surface 43B of the support substrate 43, it is possible to decrease the size of the probe device 11 compared with the related-art probe device 130 (see FIG. 2) in which the second heater 137 for heating the probe card 136 is provided at a position away from the probe card 136.

Since the wiring pattern is used as the resistance heating element 27, it is possible to perform a process of forming the resistance heating element 27 as a part of and at the same time with the manufacturing process of the probe card 24.

Referring to FIG. 3, the temperature detecting unit 28 is provided in the vicinity of the center of the top surface 43A of the support substrate 43. The temperature detecting unit 28 is electrically connected to the power supply 29 (not shown). The temperature detecting unit 28 is used to detect the temperature at the portion of the support substrate 43 corresponding to the disposition position of the probe pin 48. The temperature detecting unit 28 transmits data on the detected temperature of the substrate 43 to the power control unit 30. A temperature sensor may be used as the temperature detecting unit 28, for example.

Referring to FIG. 3, the power supply 29 is electrically connected to the resistance heating element 27 and the power control unit 30. The power supply 29 includes the plus terminal 29A and the minus terminal 29B. Referring to FIG. 5, the plus terminal 29A is electrically connected to the one end 27A of the resistance heating element 27 while the minus terminal 29B is electrically connected to the other end 27B of the resistance heating element 27. The power supply 29 is used to supply power to the resistance heating element 27 so that the resistance heating element 27 generates heat.

Referring to FIG. 3, the power control unit 30 is electrically connected to the temperature detecting unit 28 and the power supply 29. The power control unit 30 is used to control the power supply 29 (specifically, to control the power that the power supply 29 supplies to the resistance heating element 27) so that the temperature at the portion of the support substrate 43 corresponding to the disposition portion of the probe pins 48 is substantially equal to the predetermined temperature Tx on the basis of the data on the temperature of the support substrate 43 transmitted from the temperature detecting unit 30.

As described above, since the probe device of the present embodiment is provided with the temperature detecting unit 28 that detects the temperature at the portion of the support substrate 43 corresponding to the disposition position of the probe pin 48 and is also provided with the power control unit 30 that controls the power applied to the resistance heating unit 27 on the basis of the temperature of the support substrate 43 detected by the temperature detecting unit 28, it is possible to control the temperature with high precision so that the temperature at the portion of the support substrate 43 corresponding to the disposition position of the probe pin 48 is substantially equal to the predetermined temperature Tx.

In the probe device according to the present embodiment, since the resistance heating element 27 is provided on the bottom surface 43B of the support substrate 43, the support substrate 43 is heated so that the temperature at the portion of the support substrate 43 corresponding to the disposition position of the probe pin 48 reaches the predetermined temperature Tx (at which the electrical inspection of the semiconductor device 20 is performed). Therefore, it is possible to prevent the contact failure between the probe pin 48 (specifically, the front end of the probe pin 48 which makes contact with the external connection pad 33) and the external connection pad 33. Accordingly, it is possible to perform the electrical inspection of the semiconductor device 20 heated to the predetermined temperature Tx with high precision.

Since the resistance heating element 27 is provided on the bottom surface 43B of the support substrate 43, it is possible to decrease the size of the probe device 11 compared with the related-art probe device 130 (see FIG. 2) in which the second heater 137 for heating the probe card 136 is provided at a position away from the probe card 136.

In the present embodiment, the disposition position of the resistance heating element 27 is not limited to the position shown in FIG. 3. For example, the resistance heating element 27 may be disposed on the top surface 43A of the support substrate 43.

The disposition position of the temperature detecting unit 28 is not limited to the position shown in FIG. 3. For example, the temperature detecting unit 28 may be disposed on the bottom surface 43B of the support substrate 43.

Second Embodiment

Figure 6:
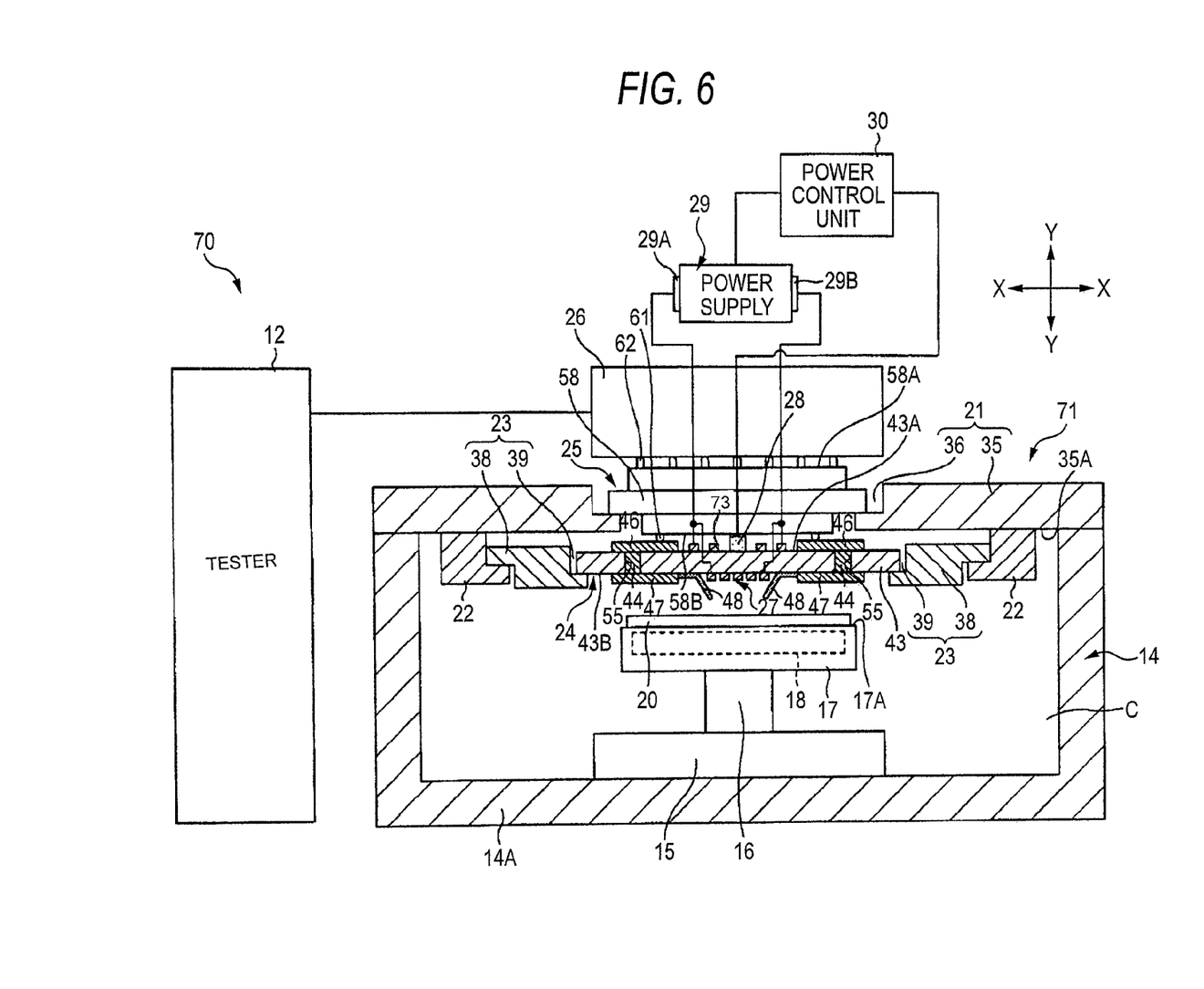
FIG. 6 is a cross-sectional view of an inspection apparatus according to a second embodiment of the invention.

FIG. 6 is a cross-sectional view of an inspection apparatus according to a second embodiment of the invention. In FIG. 6, constituent elements identical to those of the inspection apparatus 10 according to the first embodiment are denoted by the same reference numerals.

Referring to FIG. 6, an inspection apparatus 70 according to the second embodiment is configured similar to the inspection apparatus 10 except that a probe device 71 is provided in the inspection apparatus 70 of the second embodiment instead of the probe device 11 of the inspection apparatus 10 of the first embodiment.

The probe device 71 is configured similar to the probe device 11 except that a resistance heating element 73 is further provided in the probe device 71 of the second embodiment in addition the configuration of the probe device 11 of the first embodiment.

Figure 7:
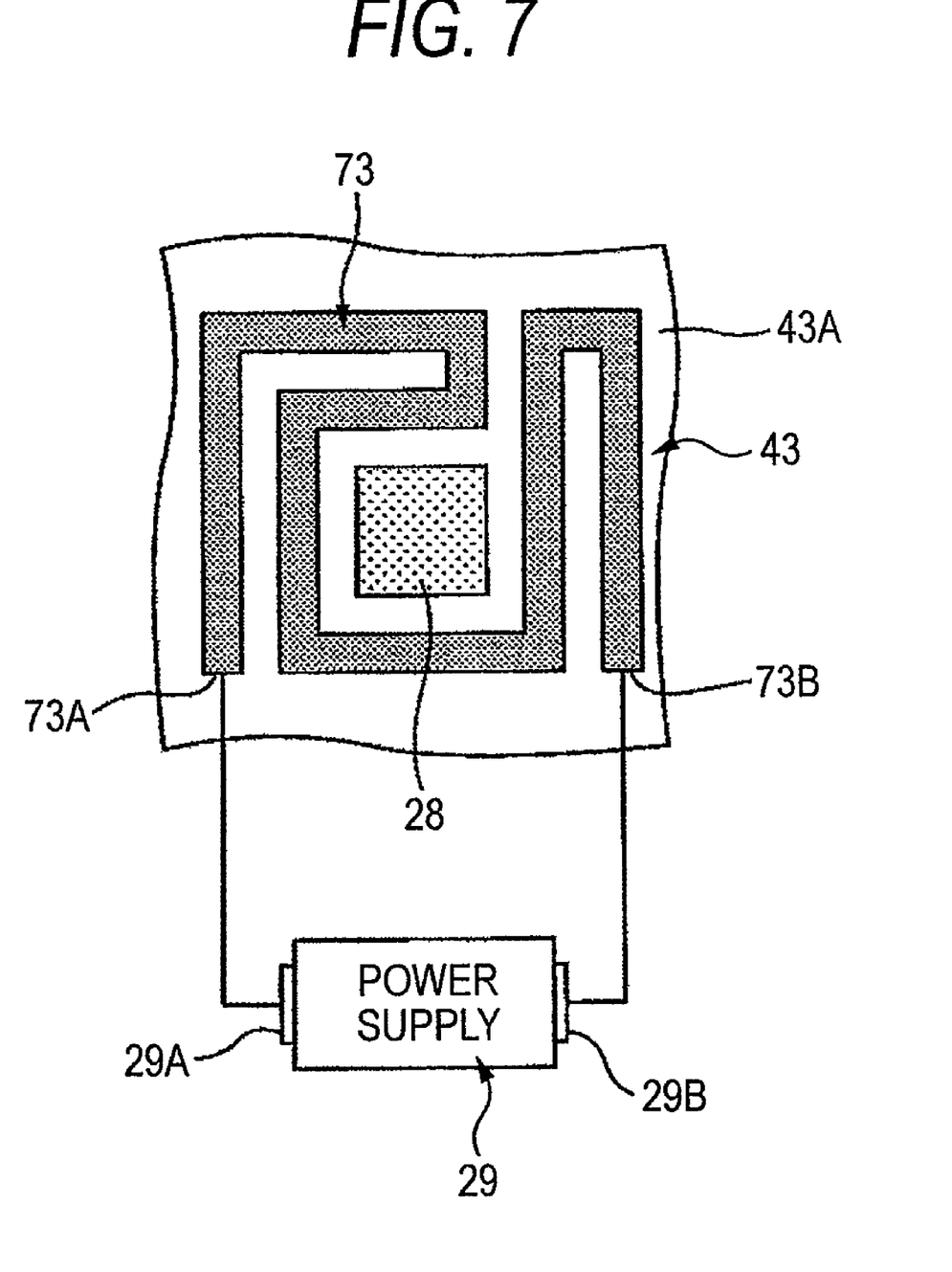
FIG. 7 is a plan view of a resistance heating element provided on a top surface of a support substrate.

FIG. 7 is a plan view of a resistance heating element provided on a top surface of a support substrate.

Referring to FIGS. 6 and 7, the resistance heating element 73 is provided on the top surface 43A of the support substrate 43 located substantially in the vicinity of the center of the support substrate 43. The resistance heating element 73 is the wiring pattern formed by patterning the metallic film. One end 73A of the resistance heating element 73 is electrically connected to the plus terminal 29A of the power supply 29 and the other end 73B of the resistance heating element 73 is electrically connected to the minus terminal 29B of the power supply 29. The resistance heating element 73 generates heat when supplied with power from the power supply 29. The resistance heating element 73 is used to heat the support substrate 43 so that the temperature at the portions of the support substrate corresponding to the disposition portion of the probe pin 48 is substantially equal to the predetermined temperature Tx (at which the electrical inspection of the semiconductor device 20 is performed). As a material for the resistance heating element 73, a metal such as Ti or Ni having the high resistance value may be used. When Ni is used as the material for the resistance heating element 73, the resistance heating element 73 may be formed using a method such as a subtractive process, a semi-additive process or a printing process.

In the probe device according to the present embodiment, by providing the resistance heating element 27 on the bottom surface 43B of the support substrate 43 and providing the resistance heating element 73 on the top surface 43A of the support substrate 43, thereby heating the portion of the support substrate 43 corresponding to the disposition portion of the probe pin 48 from both sides of the support substrate, it is possible to prevent the deformation of the portion of the support substrate 43 corresponding to the disposition portion of the probe pin 48. With this configuration, it is possible to prevent the contact failure between the probe pin 48 (specifically, the front end of the probe pin 48 which makes contact with the external connection pad 33) and the external connection pad 33 and thus to perform the electrical inspection of the semiconductor device 20 heated to the predetermined temperature Tx with high precision.

Since the resistance heating elements 27 and 73 are provided to the support substrate 43, it is possible to decrease the size of the probe device 70 compared with the related-art probe device 130 (see FIG. 2) in which the second heater 137 is provided at a position away from the probe card 136.

The disposition position of the resistance heating element 73 is not limited to the position shown in FIG. 6.

Hereinabove, although the preferred embodiments of the invention have been described and illustrated in detail, the invention is not limited to these specific embodiments and may be modified in various forms within the scope of the gist of the invention disclosed in the appended claims.

The invention can be applied to a probe device for measuring electrical properties of a semiconductor device heated to a predetermined temperature.

What is claimed is:

1. A probe device comprising:
    a stage for fixing a semiconductor device having an external connection pad;
    a heating unit provided in the stage, for heating the semiconductor device to a predetermined temperature;
    a probe card having a plurality of probe pins and a support substrate for supporting the probe pins, the probe pins being to be brought in contact with the external connection pad of the semiconductor device heated to the predetermined temperature when said probe device performs an electrical inspection of the semiconductor device; and
    a resistance heating element provided on a first surface of the support substrate, on which first surface the probe pins are disposed, in an area of the first surface surrounded by the probe pins, for heating a portion of the support substrate corresponding to a disposition portion of the probe pins to a temperature substantially equal to the predetermined temperature.

2. The probe device according to claim 1, further comprising:
    a temperature detecting unit provided in the support substrate, for detecting the temperature at the portion of the support substrate corresponding to the disposition portion of the probe pins; and
    a power control unit for controlling a power that is applied to the resistance heating element so that the temperature detected by the temperature detecting unit is substantially equal to the predetermined temperature.

3. The probe device according to claim 1, wherein the resistance heating element is provided on the first surface of the support substrate on which the probe pins is disposed and on a second surface of the support substrate opposite the first surface.

4. The probe device according to claim 1, wherein the resistance heating element is a wiring pattern formed by patterning a metallic film.

5. The probe device according to claim 1, wherein a thermal expansion coefficient of the support substrate is substantially equal to that of the semiconductor device.

6. The probe device according to claim 1, wherein the resistance heating element is provided on the first surface of the support substrate on which the probe pins are disposed, in the area of the first surface surrounded by the probe pins, and without being disposed on a location of the surface outside the area.

* * * * *